(12) United States Patent
Crand

(10) Patent No.: US 8,149,053 B2
(45) Date of Patent: Apr. 3, 2012

(54) LOW NOISE AMPLIFIER

(75) Inventor: Olivier Crand, Parfouru Jur Odon (FR)

(73) Assignee: NXP B.V., Eindhoven (NL)

( * ) Notice: Subject to any disclaimer, the term of this patent is extended or adjusted under 35 U.S.C. 154(b) by 412 days.

(21) Appl. No.: 12/095,583

(22) PCT Filed: Nov. 28, 2006

(86) PCT No.: PCT/IB2006/054484
§ 371 (c)(1),
(2), (4) Date: Jun. 5, 2008

(87) PCT Pub. No.: WO2007/063494
PCT Pub. Date: Jun. 7, 2007

(65) Prior Publication Data
US 2010/0219890 A1    Sep. 2, 2010

(30) Foreign Application Priority Data

Dec. 2, 2005   (EP) ..................... 05300998

(51) Int. Cl.
*H03F 1/00* (2006.01)
(52) U.S. Cl. ...................................... 330/188
(58) Field of Classification Search .................. 330/79, 330/188, 189, 276
See application file for complete search history.

(56) References Cited

U.S. PATENT DOCUMENTS

| | | | |
|---|---|---|---|
| 2,934,709 A | * | 4/1960 | Williams, Jr. .................. 330/9 |
| 3,210,689 A | | 10/1965 | Burwen |
| 3,243,511 A | | 3/1966 | Erdman et al. |
| 3,440,553 A | | 4/1969 | Gerard |
| 3,530,411 A | * | 9/1970 | Sear ............................... 333/243 |
| 4,100,596 A | * | 7/1978 | Olafson et al. ............... 363/148 |
| 6,985,578 B2 | | 1/2006 | Servaes et al. |

FOREIGN PATENT DOCUMENTS

| | | | |
|---|---|---|---|
| GB | 1473106 A | | 5/1977 |
| GB | 1588303 A | | 4/1981 |
| GB | 2403361 A | | 12/2004 |
| JP | 52008756 A | * | 1/1977 |
| JP | 53-177221 U | | 6/1980 |
| JP | 58200609 A | | 11/1983 |
| JP | 5-191157 A | | 7/1993 |
| JP | 10-075128 A | | 3/1998 |
| JP | 2002-100942 | | 5/2002 |

* cited by examiner

*Primary Examiner* — Robert Pascal
*Assistant Examiner* — Khiem Nguyen

(57) ABSTRACT

The present invention relates to a low noise amplifier comprising a transformer, a first amplifier and a feedback resistor, the transformer comprising a primary stage and a secondary stage. The secondary stage is connected to the input of the first amplifier and the output of the first amplifier is connected in series with a feedback resistor and the primary stage of said transformer.

20 Claims, 5 Drawing Sheets

LOW NOISE AMPLIFIER

The present invention relates to a low noise amplifier, and in particular to a low noise amplifier used in silicon tuners and transmission chains requiring low noise figures.

A low noise amplifier (LNA) comprises an electronic amplifier commonly used in communication systems to amplify weak signals received by an antenna. LNAs are generally, but not exclusively, located at the antenna and are placed at the front-end of the radio frequency (RF) section of a receiver system. It is known that the overall noise figure of the receiver front-end is dominated by the first few stages of the receiver. The noise figure is the ratio of the output noise power of a device to the portion thereof attributable to thermal noise in the input termination at standard noise temperature (usually 290 K). In systems such as those containing discrete components noise can be introduced for each component added to the system which can result from Thermal or Johnson noise, shot noise or flicker noise. Furthermore, noise can be added as a result of a noise signal contained in an input signal. However, generally noise figure is introduced due to Rc thermal noise at the input of the LNA, which can be described 4kTB/Rc, which is inversely proportional to the Rc.

Using an LNA, the noise of the subsequent stages of the receiver can be reduced by the gain of the LNA, and the noise of the LNA is injected directly into the received signal. Thus, it is necessary for a LNA to boost the desired signal power while adding as little noise and distortion as possible so that the retrieval of this signal is possible in the later stages in the system.

LNAs are typically designed to contribute a minimum amount of thermal noise to the received signal whilst also amplifying the received signal.

LNAs can be used in system-in-package (SiP) arrangements. SiP allows multiple components to be integrated into a single package. Typically, such arrangements allow a variety of components such as CPU, logic, analogue and memory functions to be mixed, reducing overall system size. Using SiP allows for reduced system board space, which ultimately leads to reduced device size.

Known LNAs, and in particular those implemented using SiP arrangements do however exhibit limited noise-reduction figures. To-date, typically, the best noise figure achieved by a conventional LNA for a TV tuner is approximately 4 dB.

The present invention seeks to provide for a low noise amplifier having advantages over known such amplifiers.

According to the present invention a low noise amplifier is provided comprising a transformer, a first amplifier and a resistive element, the transformer comprising a primary stage and a secondary stage, wherein the secondary stage is connected to the input of the first amplifier and the output of the first amplifier is connected by way of a feedback connection employing the resistive element to the primary stage of said transformer.

As a result, the low noise amplifier according to the present invention provides for a reduced noise figure compared with prior art devices whilst maintaining a constant gain factor. Reducing the noise figure allows for detection of extremely small or weak input signals which would otherwise be lost in noise signals.

Preferably, the low noise amplifier further includes a second amplifier connected to and in series with the secondary stage of the transformer and first amplifier. A mid-point of the secondary stage of the transformer is connected to ground. The output of the low noise amplifier can then be located between the outputs of the first and second amplifiers.

Additionally, the low noise amplifier can be implemented on a system-in-package. As a result the low noise amplifier of the present invention can be implemented on a reduced system board space, ultimately leading to reduced device size.

The invention is described further hereinafter by way of example only with reference to the accompanying drawings in which.

Figure 3:
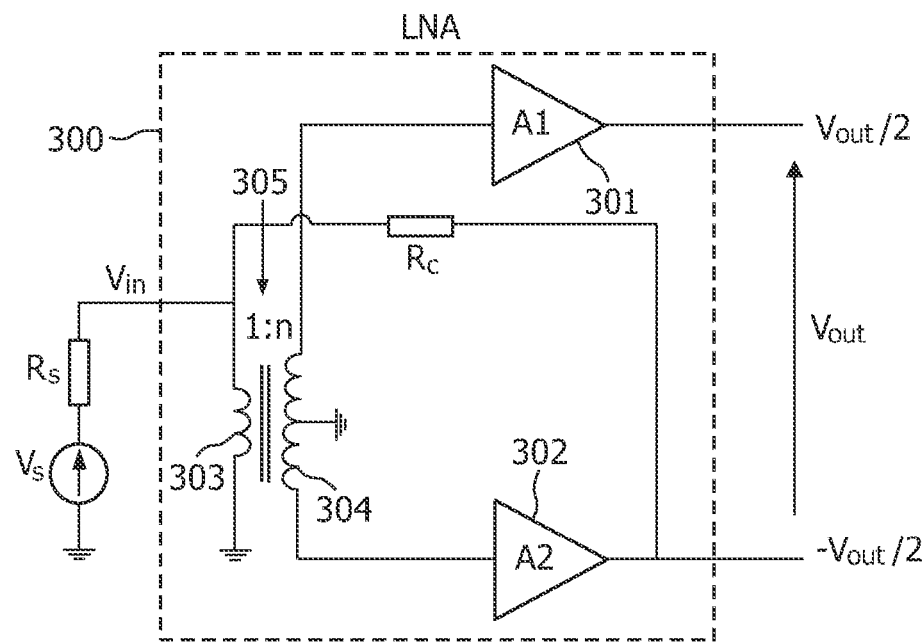
FIG. 3 illustrates a circuit diagram of a symmetrical low noise amplifier according to a first embodiment of the present invention.
Figure 5A:
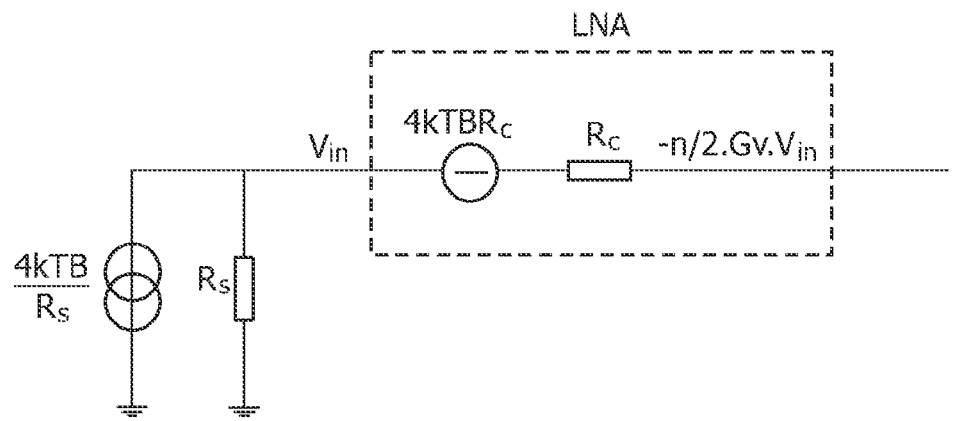
Figure 5B:
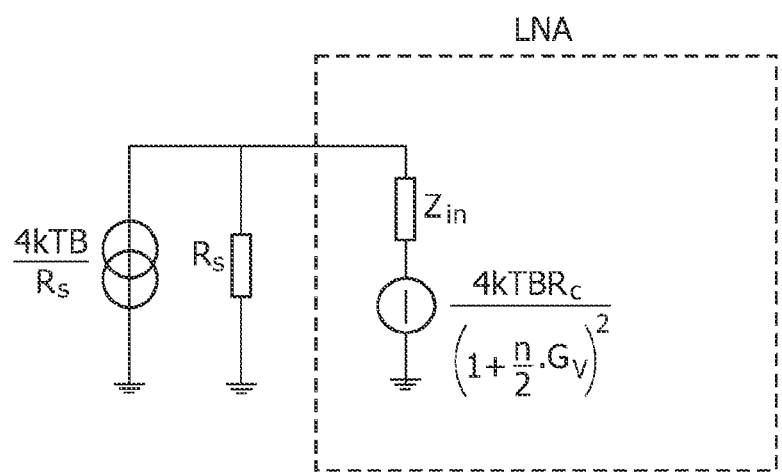
Figure 5C:
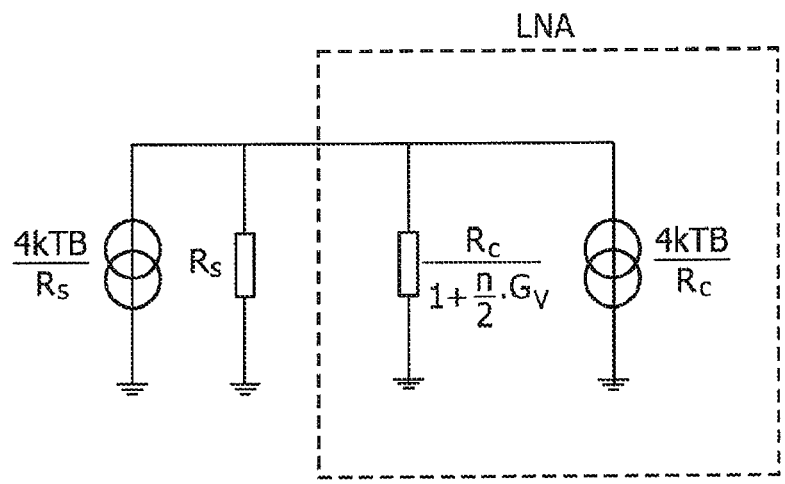
Figure 6:
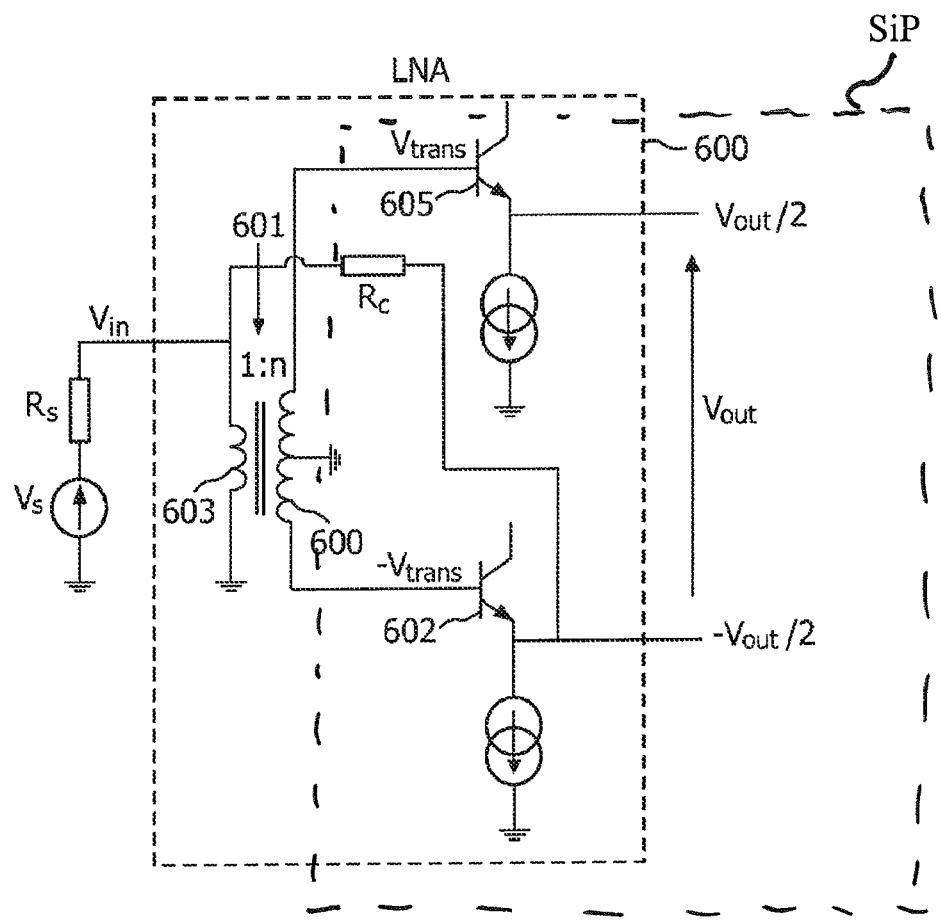
Figure 7:
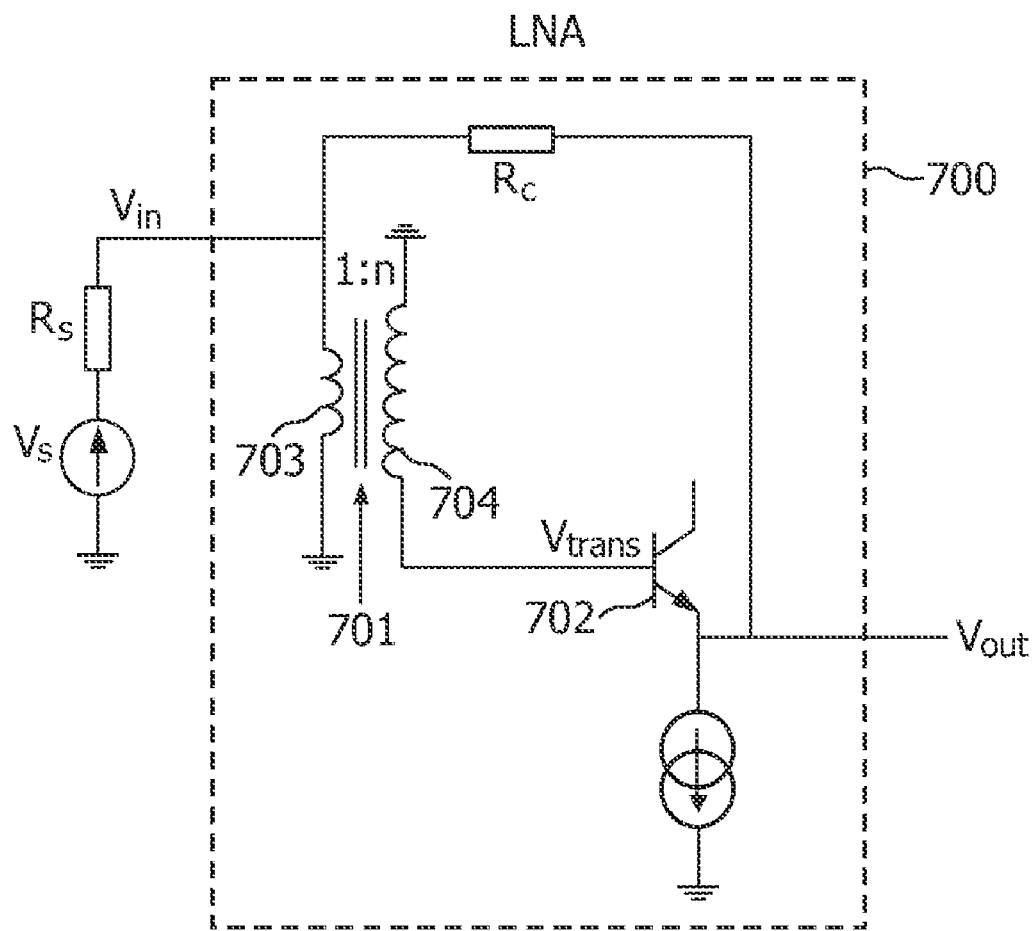

FIGS. 5a, 5b and 5c further illustrate equivalent circuit diagrams for noise figure calculation of the low noise amplifier according to the embodiment of the present invention of FIG. 3; and FIG. 6 illustrates a circuit diagram of an implementation of a symmetrical low noise amplifier according to the embodiment of the present invention of FIG. 3; and FIG. 7 shows an asymmetrical LNA arrangement according to a further embodiment of the present invention.

Figure 1:
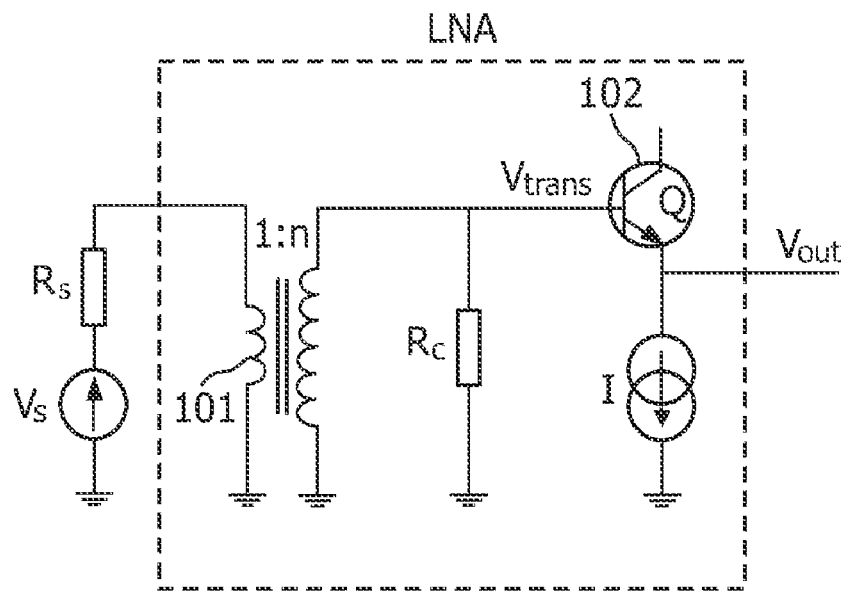
FIG. 1 shows a circuit diagram for a low noise amplifier according to the prior art.

A known arrangement is shown in FIG. 1, and comprises an LNA including a transformer combination 101, and can for example further include a transistor 102 arranged as a voltage follower. The transformer comprises primary and secondary windings, having a turns ratio of 1:n, where n corresponds to the number of secondary windings and is greater than one.

Assuming that the transformer acts as an ideal transformer, then it provides voltage gain but does not provide any power gain. Power P is given by:

$$P = V.I \qquad \text{Eqn. 1}$$

knowing that the power is constant;

$$P_{in} = P_{out} \qquad \text{Eqn. 2}$$

and using Eqn. 1, then:

$$V_{in}.I_{in} = V_{out}.I_{out} \qquad \text{Eqn. 3}$$

or in terms of impedance;

$$2V_{in}/Z_{in} = 2V_{out}/R_c \qquad \text{Eqn. 4}$$

The voltage gain of the transformer can be describes by:

$$V_{out} = n.V_{in} \qquad \text{Eqn. 5}$$

The input impedance of an LNA is given by:

$$Z_{in} = \frac{R_c}{n^2} \qquad \text{Eqn. 6}$$

where n is the number of turns on the secondary winding of the transistor and resistor $R_c$ is in parallel with the secondary winding of the transformer. The voltage gain $G_v$, with reference to the input impedance $Z_{in} = R_s$, can be given by:

$$G_v = 20 \text{ Log } (2V_{out}/V_s) \qquad \text{Eqn. 7}$$

where Vs is the input voltage signal to the LNA and Vout is the resultant output voltage from the LNA. Eqn. 7 can be rewritten as:

$$G_v = 20 \text{ Log } \{2n[Z_{in}/(Z_{in}+R_s)]\} \qquad \text{Eqn. 8}$$

Figure 2:
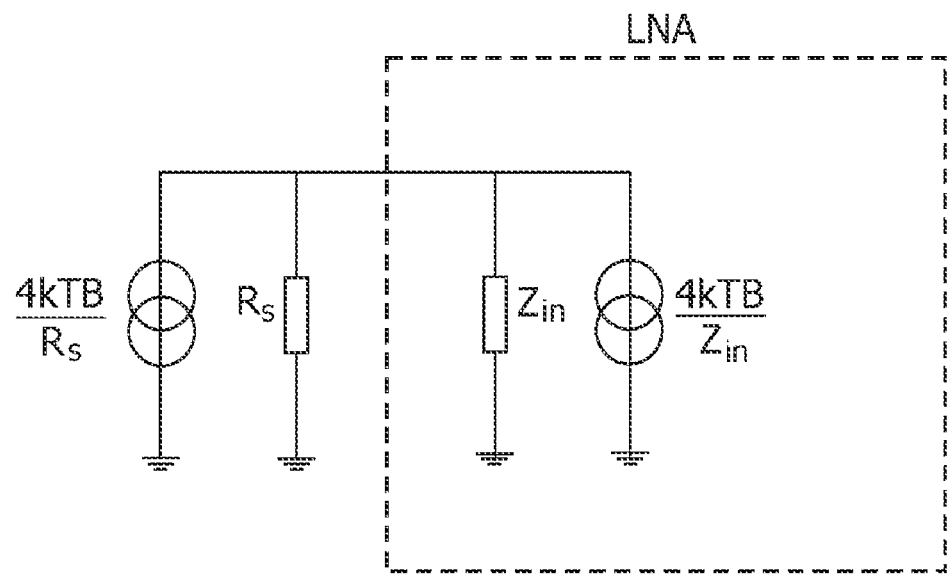
FIG. 2 shows an equivalent circuit diagram for noise figure calculation of the low noise amplifier of FIG. 1.

Referring to the equivalent circuit shown in FIG. 2 the noise figure of the LNA can be given by:

$$NF = 10 \text{ Log } [1+(N_{added}/N_{in})] \qquad \text{Eqn. 9}$$

Where $N_{added}$ is the noise introduced as a result of the LNA components and $N_{in}$ the noise introduced by the input signal. Eqn. 9 can be re-written in terms of Boltzmanns constant k, the noise temperature T, and the bandwidth of signal B:

$$NF = 10 \text{ Log } [1+((4kTB)/Z_{in})/((4kTB)/R_s)] \qquad \text{Eqn. 10}$$

In terms of the input impedance of the LNA given by Eqn. 6 and assuming that Zin=Rs the noise figure for a LNA in terms of component values Rs, Rc and n2, is thus given by:

$$NF = 10 \cdot \text{Log}\left(1 + \frac{n^2 \cdot R_s}{R_c}\right) \qquad \text{Eqn. 11}$$

By way of example, and employing component values of $R_s$=75Ω, n=2 and $R_c$=650Ω, Eqns. 6, 10 and 11 yield an input impedance $Z_{in}$=162.5Ω, a gain $G_V$=8.7 dB and a noise figure NF=1.65 dB, respectively.

In overview, and referring to FIG. 3, a LNA 300 according to a first embodiment of the present invention includes two voltage amplifiers 301, 302 each having a gain $G_v$. Also included is a transformer 305 having a primary winding 303 and a secondary winding 304. The signal to be amplified $V_s$ is connected in parallel to the primary winding.

The input of the first amplifier 301 is connected to a first end of the secondary winding 304, whilst the input of the second amplifier 302 is connected to a second end of the secondary winding 304. Additionally, the secondary winding 304 includes a centre tap arranged so that the output voltage at each end of the winding will be $V_{in}$.n/2. Preferably the centre tap is connected to ground.

As well as providing a first output terminal for the LNA, the output of the second amplifier 302 is fed-back to a first end of the primary winding 303 via a feedback resistor $R_c$. The second output terminal of the LNA is provided by the output of the first amplifier 301. The input signal to be amplified is connected in parallel with the first end of said primary winding using a series input resistor $R_s$.

The first and second amplifiers 301 and 302 each have a high input impedance compared to the impedance of the secondary winding of the transformer and can be a transistor type amplifier formed of discrete components or any appropriate integrated circuit operational amplifier, as can be understood by those skilled in the art.

Where the invention is implemented using operational amplifiers the feedback mechanism is negative feedback from the negative output of the operational amplifier.

As input impedance of each amplifier is high, the current drawn from the secondary winding of the transformer will approach zero. This prevents loading of the transformer and the voltage at the output of the LNA will be proportional to the voltage across the transformer.

The transformer 305 defines a voltage gain n, dependant on the turns ratio of the primary and secondary windings. Additionally, the input impedance of the primary and secondary windings is high and for ease of calculation is assumed to be infinite.

The input impedance $Z_{in}$ of the LNA is achieved by the transformer, resistor $R_c$ and amplifier 302, which make up an active system and for ease of calculation the active system ideally is assumed to be noiseless.

Figure 4A:
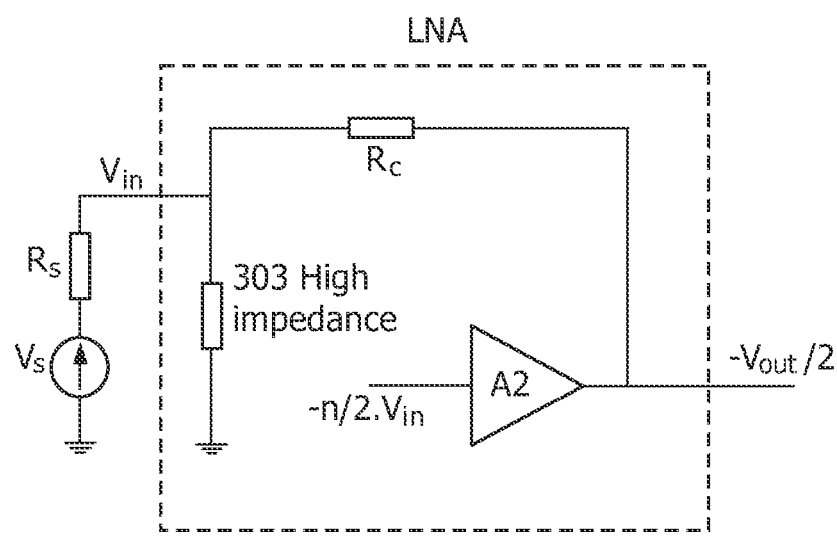
FIGS. 4a and 4b illustrate equivalent circuit diagrams for input impedance calculation of the low noise amplifier according to the embodiment of the present invention of FIG. 3.
Figure 4B:
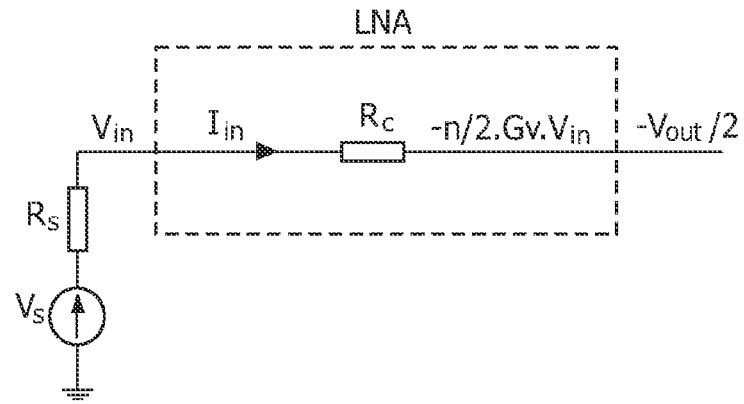

As a result, for a conventional prior art LNA circuit having the same input impedance $Z_{in}$ and gain as the present invention, the noise figure will be lower in the case of the present invention as demonstrated from the following circuit analysis. FIGS. 4a and 4b show equivalent circuits to that of FIG. 3 for the purposes of deriving the input impedance of the LNA according to the present invention.

Since the impedance of the primary winding 303 of the transformer is high, and for ease of analysis it is assumed to be infinite, no current flows through this winding and its influence can be neglected for the purposes of the following analysis. As the input impedances of both first and second amplifiers 301, 302 are equal, the voltage at each input of the amplifiers 301, 302 can be given by the terms (n/2).$V_{in}$ and (−n/2).$V_{in}$ respectively.

As such, the circuit of FIG. 3 can be represented by an equivalent circuit as shown in FIG. 4a. Since the amplifier 302, provides a gain $G_v$, the output voltage can thus be given by term (−n/2).$G_v$.$V_{in}$. Consequently, the circuit of FIG. 4a can be further reduced to the circuit as shown in FIG. 4b. Given that the input impedance of an LNA can be described by:

$$Z_{in}=I_{in}/V_{in} \qquad \text{Eqn. 12}$$

and $$I_{in}=V_{in} \cdot (1+(n/2)G_v)/Rc \qquad \text{Eqn. 13}$$

The input impedance of the LNA according to the present invention can therefore be given as:

$$Z_{in}=R_c/(1+(n/2)G_v) \qquad \text{Eqn. 14}$$

FIGS. 5a, 5b and 5c illustrate an equivalent circuit to that of FIG. 3 for the purposes of calculating the noise figure. Thermal or Johnson noise resulting from discrete components and introduced by the input signal can be described generally by the expression, 4kTB. Therefore, using the general expression for the noise figure given in Eqn. 4, the noise figure for the present invention can be represented by:

$$NF = 10 \cdot \text{Log}\left(1 + \frac{N_{added}}{N_{in}}\right) = 10 \cdot \text{Log}\left(1 + \frac{\frac{4kTB}{R_c}}{\frac{4kTB}{R_s}}\right) \qquad \text{Eqn. 15}$$

or more simply as $$NF = 10 \cdot \text{Log}\left(1 + \frac{R_s}{R_c}\right) \qquad \text{Eqn. 16}$$

By way of example, using component values of $R_s$=75Ω, n=2 and $R_c$=500Ω, with Eqns. 6, 10 and 16 yield an input impedance $Z_{in}$=162.5Ω, a gain $G_V$=8.8 dB and a noise figure NF=0.61 dB, respectively. In this case the value of $R_c$ was chosen to achieve the correct input impedance $Z_{in}$ and as compared with the prior art example of FIG. 1. Therefore, it can be see that the same gain and input impedance are achieved with a value of $R_c$ larger than that of the prior art example and a lower noise figure results.

FIG. 6 illustrates a symmetrical LNA arrangement 600 according to the first embodiment of the present invention. The output terminal of a first transistor 602 is fed-back to a first terminal of a primary winding 603 of a transformer 601 via a feedback resistor $R_c$. The second terminal of the primary winding is connected to ground. The first terminal of the secondary winding 604 is connected to the input of the first transistor 602, where the first transistor 602 is arranged as a voltage follower. The second terminal of the secondary winding 604 is connected to the input terminal of a second transistor 605, arranged as a voltage follower. The output of the LNA is measured across the output terminals of the first and second transistors 602, 605, respectively.

By following a similar analysis as for the embodiment of FIG. 3, the resultant expression for the noise figure is that of Eqn. 16.

From a comparison of the noise figure for the prior art example given in Eqn. 11 with the noise figure for the LNAs according to the first embodiment of present invention given by Eqn. 16 it can be seen that the noise figure of the present invention is lower than that of the prior art LNA described.

By using Eqn. 14 the noise figure is a factor of $1+[(n/2).G_v.R_s]/[R_c+R_s]$ lower, when compared to the prior art LNA described.

FIG. 7 shows an asymmetrical LNA arrangement according to a further embodiment of the present invention. As with the first embodiment, the output terminal of the transformer 702 is fed-back to a first terminal of the primary winding 703 via a feedback resistor $R_c$. The second terminal of the primary winding 703 is connected to ground. The first terminal of the secondary winding 704 is connected to the input of the transistor 702, where the transistor is arranged as a voltage follower. The second terminal of the secondary winding is connected to ground.

Again by following a similar analysis as for the embodiment of FIG. 3, the resultant expression for the noise figure is that of Eqn. 16. Additionally, from a comparison of the noise figure for the prior art example given in Eqn. 11 with the noise figure for the LNAs according to the further embodiment of present invention given by Eqn. 16, it can be seen that the noise figure of the present invention is a factor of $1+[n.G_v.R_s]/[R_c+R_s]$ lower than that of the prior art LNA described.

The noise figure and input impedance in the symmetrical arrangement will be equal to those of the asymmetrical embodiment if n is replaced by n/2.

The symmetrical arrangement provides good immunity to ground bouncing and also improves second order linearity such as second order intermodulation intercepts or IP2. Moreover, both symmetrical outputs are independent and could be used also as two asymmetrical outputs.

As a result, the low noise amplifier according to the present invention provides for a reduced noise figure compared with prior art devices whilst maintaining a constant gain factor and input impedance. Reducing the noise figure allows for detection of extremely small or weak input signals which would otherwise be lost in noise signals.

The invention claimed is

1. A low noise amplifier comprising a transformer, a first amplifier and a resistive element, the transformer comprising a primary stage and a secondary stage, wherein the secondary stage is connected to the input of the first amplifier and the output of the first amplifier is connected by way of a feedback connection employing the resistive element to the primary stage of said transformer, the output of the first amplifier providing the only feedback to the primary stage of the transformer; and a second amplifier connected to and in series with the secondary stage of the transformer and first amplifier.

2. The low noise amplifier of claim 1, wherein the output of the low noise amplifier is provided between the outputs of the first and second amplifiers.

3. The low noise amplifier of claim 1, wherein the second amplifier has a high input impedance.

4. The low noise amplifier of claim 1, wherein the first amplifier is a first transistor and the second amplifier is a second transistor.

5. The low noise amplifier of claim 4, wherein a gate of the first transistor and a gate of the second transistor are each coupled to the secondary stage of the transformer.

6. The low noise amplifier of claim 5, wherein a first collector/emitter of the first transistor and a first collector/emitter of the second transistor are coupled to a power source.

7. The low noise amplifier of claim 6, wherein a second collector/emitter of the first transistor is coupled to a first output of the low noise amplifier and a second collector/emitter of the second transistor is coupled to a second output of the low noise amplifier.

8. The low noise amplifier of claim 1, wherein the second amplifier is not connected by way of a feedback connection to the primary stage of said transformer.

9. The low noise amplifier of claim 1, wherein the output of the first amplifier and output of the second amplifier are each configured to function as separate asymmetrical outputs of the low noise amplifier.

10. A low noise amplifier comprising a transformer, a first amplifier having a high input impedance, and a resistive element, the transformer comprising a primary stage and a secondary stage, wherein the secondary stage is connected to the input of the first amplifier and the output of the first amplifier is connected by way of a feedback connection employing the resistive element to the primary stage of said transformer, the output of the first amplifier providing the only feedback to the primary stage of the transformer.

11. The low noise amplifier of claim 10 implemented on a system-in-package.

12. The low noise amplifier of claim 11, wherein the transformer is external to the system-in-package implementation.

13. A tuner including the low noise amplifier as claimed in claim 10.

14. The low noise amplifier of claim 10, wherein an input of the low noise amplifier is directly coupled to a first end of the primary stage of the transformer.

15. The low noise amplifier of claim 10, wherein the low noise amplifier is configured to maintain a constant gain factor and input impedance.

16. A low noise amplifier comprising a transformer, a first amplifier and a resistive element, the transformer comprising a primary stage and a secondary stage, wherein the secondary stage is connected to the input of the first amplifier and the output of the first amplifier is connected by way of a feedback connection employing the resistive element to the primary stage of said transformer, the output of the first amplifier providing the only feedback to the primary stage of the transformer, and a mid-point of the secondary stage of the transformer is connected to ground.

17. A tuner including the low noise amplifier as claimed in claim 16.

18. A low noise amplifier comprising:
an amplifier circuit having an asymmetrical output and having a first amplifier;
an input transformer having a primary stage and a secondary stage, a first terminal of the secondary stage of the transformer coupled to an input of the first amplifier and a second terminal of the secondary stage of the transformer coupled to a ground voltage; and
a resistive element, the asymmetrical output of the first amplifier coupled by way of a feedback connection employing the resistive element to a first end of the primary stage of the transformer, and a second end of the primary stage of the transformer coupled to the ground voltage, the asymmetrical output providing the only feedback to the primary stage of the transformer; and
a second amplifier connected to and in series with the secondary stage of the transformer and first amplifier.

19. The low noise amplifier of claim 18, wherein an input of the low noise amplifier is coupled directly to the first end of the primary stage of the transformer.

20. A tuner including the low noise amplifier as claimed in claim 18.

* * * * *